US010106307B2

(12) United States Patent
Day

(10) Patent No.: US 10,106,307 B2
(45) Date of Patent: Oct. 23, 2018

(54) SHEET METAL EXPLOSION-PROOF, AND FLAME-PROOF ENCLOSURES

(71) Applicant: Life Safety Distribution GmbH, Hegnau (CH)

(72) Inventor: Christopher Day, Poole (GB)

(73) Assignee: Life Saftey Distribution GmbH, Hegnau (CH)

( * ) Notice: Subject to any disclaimer, the term of this patent is extended or adjusted under 35 U.S.C. 154(b) by 0 days.

(21) Appl. No.: 14/991,690

(22) Filed: Jan. 8, 2016

(65) Prior Publication Data

US 2016/0122110 A1    May 5, 2016

Related U.S. Application Data

(62) Division of application No. 12/813,667, filed on Jun. 11, 2010, now Pat. No. 9,247,655.

(51) Int. Cl.
*B65D 81/02* (2006.01)
*H05K 5/00* (2006.01)
*B65D 6/00* (2006.01)
*F17C 13/06* (2006.01)

(52) U.S. Cl.
CPC ............ *B65D 81/02* (2013.01); *B65D 7/42* (2013.01); *H05K 5/00* (2013.01); *F17C 13/06* (2013.01)

(58) Field of Classification Search
CPC .......... F24B 39/14; F24B 39/20; F24B 39/18; B65D 81/02; B65D 7/42; H05K 5/00; F17C 13/06; F17C 13/12; F17C 2205/0308; F17C 2205/0311
USPC ...................... 220/581, 582, 88.1
See application file for complete search history.

(56) References Cited

U.S. PATENT DOCUMENTS

| | | | |
|---|---|---|---|
| 3,080,201 | A | 9/1961 | Escola |
| 3,141,008 | A | 7/1964 | Flick et al. |
| 3,775,551 | A | 11/1973 | Prehmus et al. |
| 3,951,228 | A | 4/1976 | Schnell |
| 4,512,496 | A | 4/1985 | Tsou |
| 5,323,228 | A | 6/1994 | Moody |
| 5,718,581 | A | 2/1998 | Fernwood et al. |
| 5,937,597 | A | 8/1999 | Sono et al. |
| 6,453,723 | B1 | 9/2002 | Ichikawa et al. |
| 7,479,255 | B2 | 1/2009 | Otani et al. |
| 9,247,655 | B2 | 1/2016 | Day |

FOREIGN PATENT DOCUMENTS

| | | |
|---|---|---|
| DE | 19843522 A1 | 4/2000 |
| DE | 202005005424 U1 | 7/2005 |
| WO | 2009062534 A1 | 5/2009 |

OTHER PUBLICATIONS

U.S. Appl. No. 12/813,667, Restriction Requirement, dated Mar. 21, 2012, 5 pages.

(Continued)

*Primary Examiner* — Stephen Castellano
(74) *Attorney, Agent, or Firm* — Wick Phillips Gould & Martin LLP

(57) ABSTRACT

An explosion retaining housing includes a sheet metal member or outer skin which at least in part forms an interior region of the housing. At least one structural element provides additional strength to the member to retain the explosion in the region. The structural element can be inside of, or, outside of the region. The structural element can have a plurality of components which cooperate together to resist the force of an explosion in the interior region.

13 Claims, 3 Drawing Sheets

(56) References Cited

OTHER PUBLICATIONS

U.S. Appl. No. 12/813,667, Office Action, dated May 18, 2012, 7 pages.
U.S. Appl. No. 12/813,667, Final Office Action, dated Sep. 5, 2012, 9 pages.
U.S. Appl. No. 12/813,667, Office Action, dated Jun. 11, 2014, 12 pages.
U.S. Appl. No. 12/813,667, Final Office Action, dated Sep. 23, 2014, 11 pages.
U.S. Appl. No. 12/813,667, Office Action, dated Feb. 25, 2015, 9 pages.
U.S. Appl. No. 12/813,667, Notice of Allowance, dated Sep. 15, 2015, 7 pages.
Europe Patent Application No. 11168858.6, Extended European Search Report, dated May 4, 2017, 4 pages.
Europe Patent Application No. 11168858.6, Examination Report, dated May 18, 2017, 4 pages.

SHEET METAL EXPLOSION-PROOF, AND FLAME-PROOF ENCLOSURES

CROSS-REFERENCE TO RELATED APPLICATIONS

This application is a divisional of and claims priority benefit under 35 U.S.C. § 121 to U.S. patent application Ser. No. 12/813,667, filed on Jun. 11, 2010, now U.S. Pat. No. 9,247,655, and entitled "Sheet Metal Explosion-Proof, and Flame-Proof Enclosures", which is hereby incorporated by reference for all purposes as if reproduced in its entirety.

FIELD

The invention pertains to explosion-proof, dust-ignition proof and flame-proof enclosures. More particularly, the invention pertains to such enclosures implemented, at least in part, with sheet metal-type housings.

BACKGROUND

Traditional explosion and flameproof enclosures are constructed using cast metal components. These enclosures are typically expensive, and heavy. Further, manufacture and assembly are time consuming.

Cast metal enclosures often suffer from porosity caused by blowholes and fissures leading to thick wall constructions, welded repairs and additional pressure testing requirements of the enclosure to ensure it can be operated safely within explosive gas and dust atmospheres. In summary, known explosion resistant enclosures resist the explosion pressure by use of a load bearing skin, for example a cast housing.

There is a continuing need for enclosures for housing electrical equipment intended for use in explosive gas and dust atmospheres. Such enclosures could be used to house various types of gas detectors.

DETAILED DESCRIPTION

Figure 1:
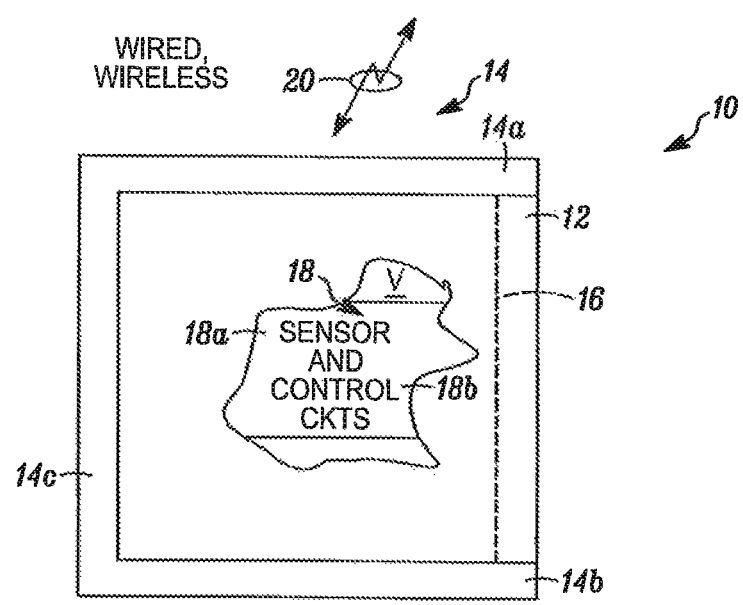
FIG. 1 is a diagram of an embodiment of the invention.

While embodiments of this invention can take many different forms, specific embodiments thereof are shown in the drawings and will be described herein in detail with the understanding that the present disclosure is to be considered as an exemplification of the principles of the invention, as well as the best mode of practicing same, and is not intended to limit the invention to the specific embodiment illustrated.

In embodiments of the invention, a thin walled explosion, dust-ignition proof and flameproof enclosure can withstand the pressure developed during an internal explosion of an explosive mixture, without damage. This containment prevents the transmission of the explosion to the explosive gas and dust atmospheres surrounding the enclosure. In such embodiments, a thin walled sheet metal structure, which is difficult to assemble using traditional fasteners while maintaining the requirements of a flame-proof joint, can advantageously be utilized.

Structural members can be incorporated which are separate from the enclosure itself. Such members can be internal or external of the respective housing. While the external housing needs to withstand and retain the pressure of an internal explosion, the addition of one or more additional, structural components which can provide some of the structural integrity of the overall housing results in this requirement being met with a much lighter housing. For example, drawn sheet metal can be used.

In one aspect of the invention, such housings can incorporate a thin sheet metal enclosure. Two metal end covers and are assembled using a threaded nut. Such sheet metal enclosures do not suffer from the same porosity issues as a cast enclosure. As a result, a lighter gauge material can be used In one embodiment, a clamped cylindrical design can be used to realize the benefits previously described of a sheet metal enclosure. In a disclosed implementation, the sheet metal enclosure is formed in a cylindrical form with openings at either end and clamped onto a cylindrical 'chassis' securely with a clamping nut. The clamping nut is a structural member which withstands the pressure developed during an internal explosion of an explosive mixture and prevents the enclosure from separating.

The cylindrical 'chassis' can include front and rear housings clamped together using one or more tie rods. The tie rods represent structural members which can withstand the pressure developed during an internal explosion of an explosive mixture and prevent the enclosure from separating. Flameproof joints can be incorporated at the interface between the front and rear housing and the cylindrical sheet metal enclosure. Such joints prevent the transmission of an internal explosion to the explosive gas atmosphere surrounding the enclosure.

FIG. 1 illustrates an embodiment of the invention. An explosion resistant enclosure 10 includes a relatively thin sheet metal-like member 12 which could have a variety of cross-sectional shapes such as circular, oval, rectangular, or square all without limitation. Characteristic of the present invention, the member 12 would not itself be of a type which would be expected to contain an internal explosion in the internal region V defined in part by the member 12. Rather, that additional strength is provided to the enclosure 10 by one of an internal framework 16, illustrated in phantom in FIG. 1, or an external framework, such as external framework 14 illustrated in FIG. 1, in combination with a separate outer skin or member 12. Those of skill will understand that the framework 14 provides explosion resisting strength and need not completely enclose the outer skin 14, as discussed below.

The framework 14 could for example be of unitary construction with a first portion 14a joined to a second portion 14b by a central portion 14c. The portions 14a,b,c can be rod-like and form a frame that can in part surround the outer skin 12. The outer, skin or, member 12 is sandwiched therebetween. As appropriate, and known to those of skill in the art, flame-proof joints could be incorporated into the enclosure 10.

The member 12 can carry in the internal region V (which might be closed in part by the framework 14) a detector 18 having a sensor 18a, and control circuits 18b. An explosion in the region V would be contained by the framework 14, in combination with the member 12. It will also be understood that the type of detector 18 is not a limitation of the invention. A variety of gas sensors can be used and come within the spirit and scope of the invention. The detector 18 can be in wired or wireless communication 20 with a displaced alarm system.

The chassis type construction of the enclosure 10 of FIG. 1 makes it possible to use a much thinner member, or outer skin, than would otherwise be possible and still retain internal explosions in the region V. The configuration 10 of FIG. 1 results in a lower cost solution when compared to traditional explosion retaining enclosures which use prior art cast members.

Those of skill will understand that the location of the framework 14 is not a limitation of the invention. It can be located in the internal region V or outside thereof as illustrated in FIG. 1. Further members of framework 14 need not be directly or integrally coupled together. Variations and permutations thereof come within the spirit and scope of the invention.

Figure 2:
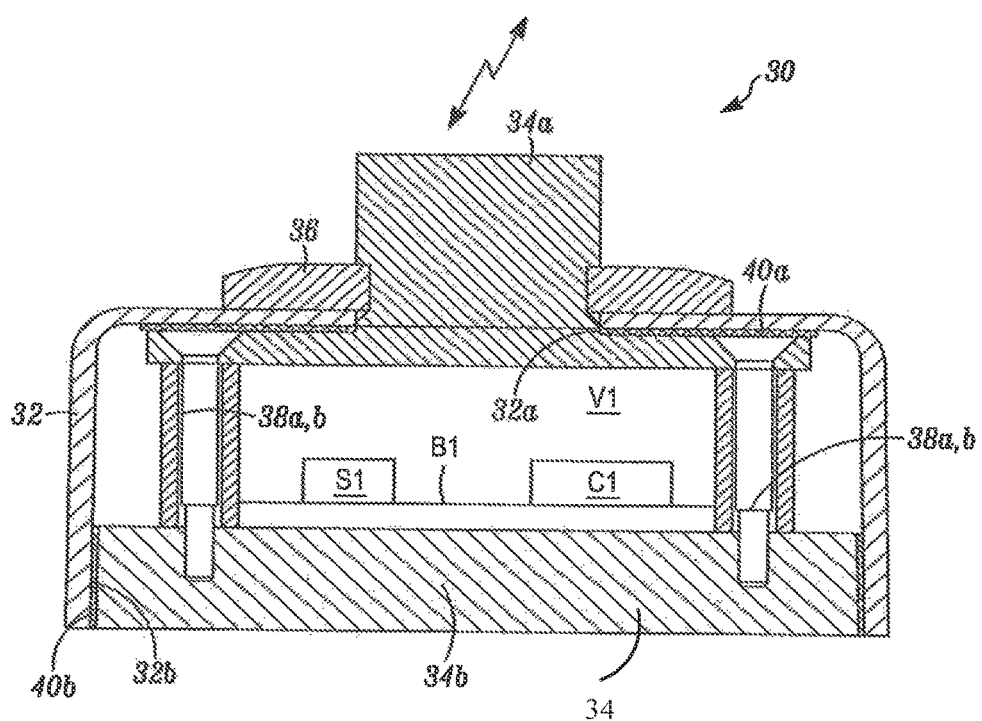
FIG. 2 is a diagram of another embodiment of the invention.

FIG. 2 illustrates an alternate embodiment 30 of the invention. In the embodiment 30 of FIG. 2, strength adding elements are located in the explosion-proof enclosed volume, region, V1. The assembly 30 includes a sheet metal enclosure 32 which can be cylindrical, without imitation.

The enclosure 32 can be formed with openings 32a,b and can bound in part the internal volume or region V1. A gas detector which includes a sensor S1 and associated control circuits CI can be carried on a printed circuit board B1 in the internal volume V1.

Enclosure 32 is clamped onto a chassis 34, having elements 34 a,b of a comparable shape, for example if the enclosure 32 is cylindrical, the chassis 34 most conveniently could also be cylindrical, A clamping nut 36 can be used to clamp the housing, or enclosure 32 to the chassis 34. The end 32a of the enclosure 32 and a portion of the element 34a can provide a cable feed through.

The clamping nut 36 is a structural member which withstands the pressure developed during an explosion in the internal region V1 due to an internal explosive mixture. The nut 36 works to prevent the enclosure 32 from separating due to the explosive pressures developed in the region V1.

The cylindrical chassis 34 includes first and second elements 34 a,b which are clamped together using tie rods and screws 38 a,b. It will be understood that the number of tie rods is not a limitation of the invention. In selected configurations, one or three or more tie rods could be used instead of two as in FIG. 2 without departing from the spirit and scope of the invention.

The tie rods 38 a,b are internal structural members which withstand the pressure developed during an explosion in the internal region V1 and also contribute to preventing the enclosure 32 from separating.

Flameproof joints 40 a,b can be incorporated at the interfaces between elements 34 a,b and the sheet metal enclosure 32. The joints 40 a,b prevent the transmission of an internal explosion to an explosive gas atmosphere surrounding the assembly 30.

In summary, as illustrated in FIG. 2, the load bearing chassis, or, structure of the assemblage 30 is separate and apart from the outer skin 32. The load bearing chassis, for example, the nut 36 and first and second elements 34 a,b in combination with the internal tie rods 38 a,b form a structure which can withstand the explosive pressure of an explosion in the region V1 and keep the outer skin 32 from separating in response to that pressure.

Figure 3:
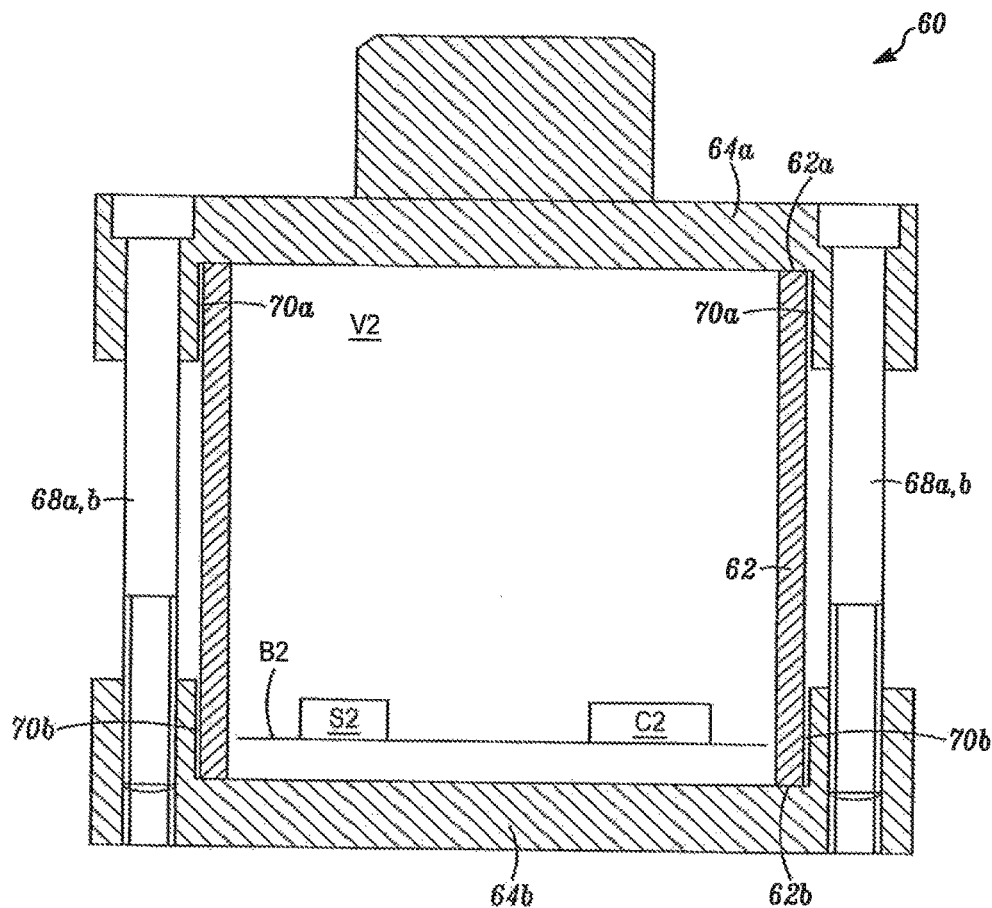
FIG. 3 is yet another embodiment of the invention.

FIG. 3 illustrates an alternate embodiment 60 of the invention. In the embodiment 60 of FIG. 3, strength adding elements are located outside of the explosion-proof enclosed volume, region, V2. The assembly 60 includes a sheet metal enclosure 62 which can be cylindrical, without limitation.

The enclosure 62 can be formed with openings 62a,b and can bound in part the internal volume or region V2. A gas detector which includes a sensor S2 and associated control circuits C2 can be carried on a printed circuit board B2 in the internal volume V2.

Enclosure 62 is clamped between first and second elements 64 a,b which are clamped together using external tie rods 68 a,b. It will be understood that the number of tie rods is not a limitation of the invention. In selected configurations, one or three or more tie rods could be used instead of two as in FIG. 3 without departing from the spirit and scope of the invention.

The tie rods 68 a,b are external structural members which withstand the pressure developed during an explosion in the internal region V2 and also contribute to preventing the relatively thin walled enclosure 62 from separating.

Flameproof joints 70 a,b can be incorporated at the interfaces between elements 34 a,b and the sheet metal enclosure 32. The joints 70 a,b prevent the transmission of an internal explosion to an explosive gas atmosphere surrounding the assembly 60.

In summary, as illustrated in FIG. 3, the load bearing structure of the assemblage 60 is separate and apart from the outer skin 62. The load bearing external tie rods 68 a, b form and ends 64 a, b form a structure which can withstand the explosive pressure of an explosion in the region V2 and keep the outer skin 62 from separating in response to that pressure.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

The invention claimed is:

1. An explosion resistant enclosure comprising:
    a sheet metal member having a first opening at a first end and a second opening at a second end, the sheet metal member defining an internal region extending between the first end and the second end;
    a gas sensor disposed within the internal region;
    a first end element disposed within the first opening;
    a second end element disposed within the second opening;
    a plurality of structural elements securing the first end element to the second end element;
    a clamping nut securing the second end element to the second end of the sheet metal member, via a threadable engagement with the second end element; and
    one or more openings between the internal region and an exterior of the sheet metal member, wherein the one or more openings are configured to provide a flame-proof structure and retain a flame within the internal region from propagating to the exterior of the sheet metal member.

2. The enclosure of claim 1, wherein the plurality of structural elements are disposed within the internal region.

3. The enclosure of claim 1, further comprising:
    processing circuitry disposed within the internal region, wherein the processing circuitry is in signal communication with the gas sensor.

4. The enclosure of claim 1, wherein the plurality of structural elements comprise a plurality of tie rods.

5. The enclosure of claim 4, wherein each of the plurality of tie rods are engaged with the first end element and the second end element.

6. The enclosure of claim 5, wherein the each of the plurality of tie rods are engaged with the first end element and the second end element via a threaded interface.

7. The enclosure of claim 1, wherein the sheet metal member includes a flanged surface disposed at the second end of the sheet metal member.

8. The enclosure of claim 7, wherein the flanged surface defines the second opening.

9. The enclosure of claim 7, wherein the clamping nut engages the flanged surface.

10. The enclosure of claim 1, wherein the one or more openings include a first opening disposed at a first interface between the first end element and the first end of the sheet metal member.

11. The enclosure of claim 10, wherein the first opening comprises a flameproof joint.

12. The enclosure of claim 10, wherein the one or more openings include a second opening disposed at a second interface between the second end element and the second end of the sheet metal member.

13. The enclosure of claim 10, wherein the second opening comprises a flameproof joint.

* * * * *